United States Patent
Jeon

(10) Patent No.: US 7,018,505 B2
(45) Date of Patent: Mar. 28, 2006

(54) APPARATUS INCLUDING CHUCK AND MATCHING BOX

(75) Inventor: Chang-Yeop Jeon, Seocho-gu (KR)

(73) Assignee: Jusung Engineering Co., Ltd., (KR)

( * ) Notice: Subject to any disclaimer, the term of this patent is extended or adjusted under 35 U.S.C. 154(b) by 154 days.

(21) Appl. No.: 10/355,777

(22) Filed: Jan. 31, 2003

(65) Prior Publication Data

US 2003/0145951 A1 Aug. 7, 2003

(30) Foreign Application Priority Data

Feb. 5, 2002 (KR) ............... 10-2002-0006555

(51) Int. Cl.
*C23F 1/00* (2006.01)
*C23C 16/00* (2006.01)
(52) U.S. Cl. .................. 156/345.44; 118/723 E
(58) Field of Classification Search ......... 156/345.44, 156/345.51; 118/723 E, 728
See application file for complete search history.

(56) References Cited

U.S. PATENT DOCUMENTS

| 5,478,429 | A | * | 12/1995 | Komino et al. | ........ 156/345.44 |
| 5,951,776 | A | * | 9/1999 | Selyutin et al. | ............. 118/729 |
| 6,132,575 | A | * | 10/2000 | Pandumsoporn et al. | ..................... 204/298.06 |
| 2004/0050327 | A1 | * | 3/2004 | Johnson et al. | ............. 118/715 |
| 2005/0011450 | A1 | * | 1/2005 | Higashiura | .............. 118/723 E |

* cited by examiner

Primary Examiner—Parviz Hassanzadeh
Assistant Examiner—Maureen G. Arancibia
(74) Attorney, Agent, or Firm—Baker & Daniels LLP

(57) ABSTRACT

An apparatus of fabricating a semiconductor device includes: a chamber; a radio frequency (RF) power supply supplying an RF power for the chamber; a matching box including a matching unit adjusting an impedance of the RF power; and a chuck penetrating a surface of the chamber, the chuck including a fixing means to fix the matching box to the chuck.

10 Claims, 3 Drawing Sheets

APPARATUS INCLUDING CHUCK AND MATCHING BOX

This application claims the benefit of Korean Patent Application No. 2002-6555, filed on Feb. 5, 2002 in Korea, which is hereby incorporated by reference for all purposes as if fully set forth herein.

BACKGROUND OF THE INVENTION

1. Field of the Invention

The present invention relates to an apparatus for a semiconductor device and more particularly, to a chuck supporting a substrate and controlling a temperature.

2. Discussion of the Related Art

Recently, a new material field in which development and treatment of new materials has been rapidly grown as development of science and results of the new material field become driving force of development in a semiconductor industry.

A semiconductor device is a large scale integrated circuit (LSI) which is fabricated through subsequent deposition and patterning processes of thin films on a substrate and theses processes are performed in a chamber which is a closed reaction vessel. A chuck is equipped in the chamber to fix the substrate. Generally, the chuck is classified into two types: a vacuum chuck fixes the substrate by applying a vacuum at its center portion; and an electrostatic chuck fixes the substrate by using a mutual action between the substrate and an electrostatic field generated by applying a direct current.

In a semiconductor industry, a method using a plasma is developed according as a substrate is enlarged and a pattern of a semiconductor device is fined. In an induced coupled plasma (ICP) method, as an example of a plasma-generating method, a time-varying electric field is induced in a chamber including gaseous materials by using a radio frequency (RF) voltage and a substrate is treated by using a plasma generated by the time-varying electric field. An RF electrode is equipped in the chamber and controls an impact energy of a plasma ion. Since a temperature control of the substrate influences characteristics of a fabricated device such as a uniformity, a critical dimension, a profile and a repeatability, a temperature control unit is included in the chamber for an effective temperature control. Moreover, a direct current electrode can be equipped in the chamber to fix the substrate for the electrostatic chuck.

FIG. 1 is a schematic perspective view showing a chuck of a related art apparatus for semiconductor device. As shown in FIG. 1, a chuck 30 includes a chuck body 30a and a chuck supporter 30b. The chuck body 30a having a plate shape is horizontally disposed in a chamber (not shown) and a substrate is loaded thereon. The chuck supporter 30b having a pipe shape supports the chuck body 30a and penetrates the chamber. Moreover, an RF electrode, a temperature control unit and a direct current (DC) electrode can be equipped in the chuck body 30a. The chuck body 30a is horizontally combined with one end of the chuck supporter 30b. The other end of the chuck supporter 30b is disposed at an exterior of the chamber and is closed with a base lid 30c of a plate shape to prevent an injection of impurities or gaseous materials into the chamber from exterior of the chamber.

The chuck 30 moves up and down by an external driving means "M" such as motor with the chamber penetrated. The RF electrode, the DC electrode and the temperature control unit equipped in the chuck body 30a are connected to the external means for their driving. Accordingly, a plurality of terminals 32 connected to the RF electrode, the DC electrode and the temperature control unit are protruded from an outer surface of the base lid 30c. The plurality of terminals 32 can be formed on an outer surface of the chuck supporter 30b according to purposes. One terminal connected to the RF electrode in the chuck body 30a is connected to an external RF power supply 76 and functions as an RF input terminal 32a. Generally, an impedance matching unit adjusting an impedance of an RF voltage is interposed between the RF input terminal and the RF power supply 76. The impedance matching unit is equipped in a matching box 74 of cubic shape and the RF input terminal 32a of the chuck 30 is electrically connected to the matching box 74 through a wire 78.

However, the chuck 30 has some disadvantages in use. Since the chuck 30 and the matching box 74 are spaced apart from each other, a connection between the chuck 30 and the matching box 74 is not reliable. Furthermore, since a path from the matching box 74 to the RF input terminal 32a is long for power transmission, an RF power loss is inevitable. The chuck 30 moves up and down by the external driving means "M" such as motor with the chamber penetrated, while the matching box 74 is spaced apart from the chuck 30 and fixed in exterior. Accordingly, a reliability of connection is reduced. Moreover, the shorter wire 78 connecting the RF input terminal 32a of the chuck 30 and the matching box 74 is better for effective transmission of the RF power, while the wire 78 should have a specific length not to disturb an independent up-and-down movement of the chuck 30. Accordingly, the RF power is inevitably lost.

SUMMARY OF THE INVENTION

Accordingly, the present invention is directed to an apparatus including a chuck and a matching box that substantially obviates one or more of problems due to limitations and disadvantages of the related art.

An object of the present invention is to provide an apparatus including a chuck and a matching box in which an RF power is reliably supplied without disturbing a movement of the chuck and a power transmission path between an RF electrode in the chuck and the matching box is minimized.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus of fabricating a semiconductor device includes: a chamber; a radio frequency (RF) power supply supplying an RF power for the chamber; a matching box including a matching unit adjusting an impedance of the RF power; and a chuck penetrating a surface of the chamber, the chuck including a fixing means to fix the matching box to the chuck.

The chamber defines a closed reaction region and the matching box has a cubic shape. The chuck includes an RF electrode connected to the matching unit inside. The chuck has one end portion inside of the chamber and the other end portion outside of the chamber. The fixing means is formed on the other end portion of the chuck and the matching box includes an RF supplying terminal electrically connected to the matching box and protruded toward the chuck.

The fixing means comprises: a connection portion horizontally protruded from and fixed to the chuck; an RF input terminal electrically connected to the RF electrode and protruded from the connection portion; a frame formed on the connection portion, the matching box being fixed in the frame; and a connector electrically connecting the RF supplying terminal and the RF input terminal. The RF supplying terminal and the RF input unit have a pin shape, the connection portion has a plate shape, and the frame has a rectangular shape.

The connector is a metal block comprising: a first surface including a first open portion corresponding to the RF supplying terminal and facing the matching box; and a second surface including a second open portion corresponding to the RF input terminal and facing the connection portion. The connector includes a copper and has an "L" shape.

The apparatus further includes a first cover surrounding the metal block except for the first and second surfaces and a second cover surrounding the first cover. The first and second covers include an insulating material and aluminum, respectively. The insulating material includes TEFLON (polytetrafluoroethylene).

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
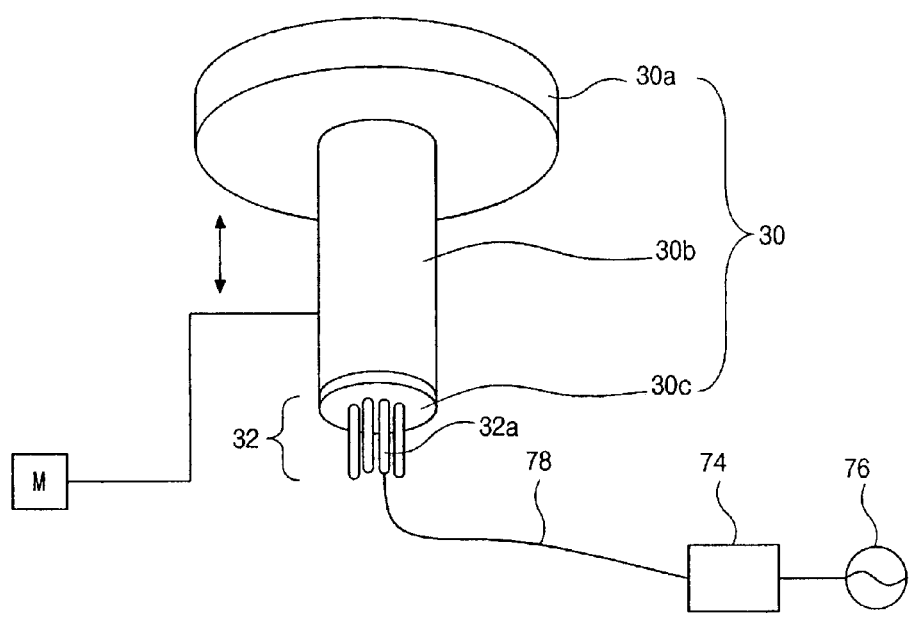
FIG. 1 is a schematic perspective view showing a chuck of a related art apparatus for semiconductor device.
Figure 2:
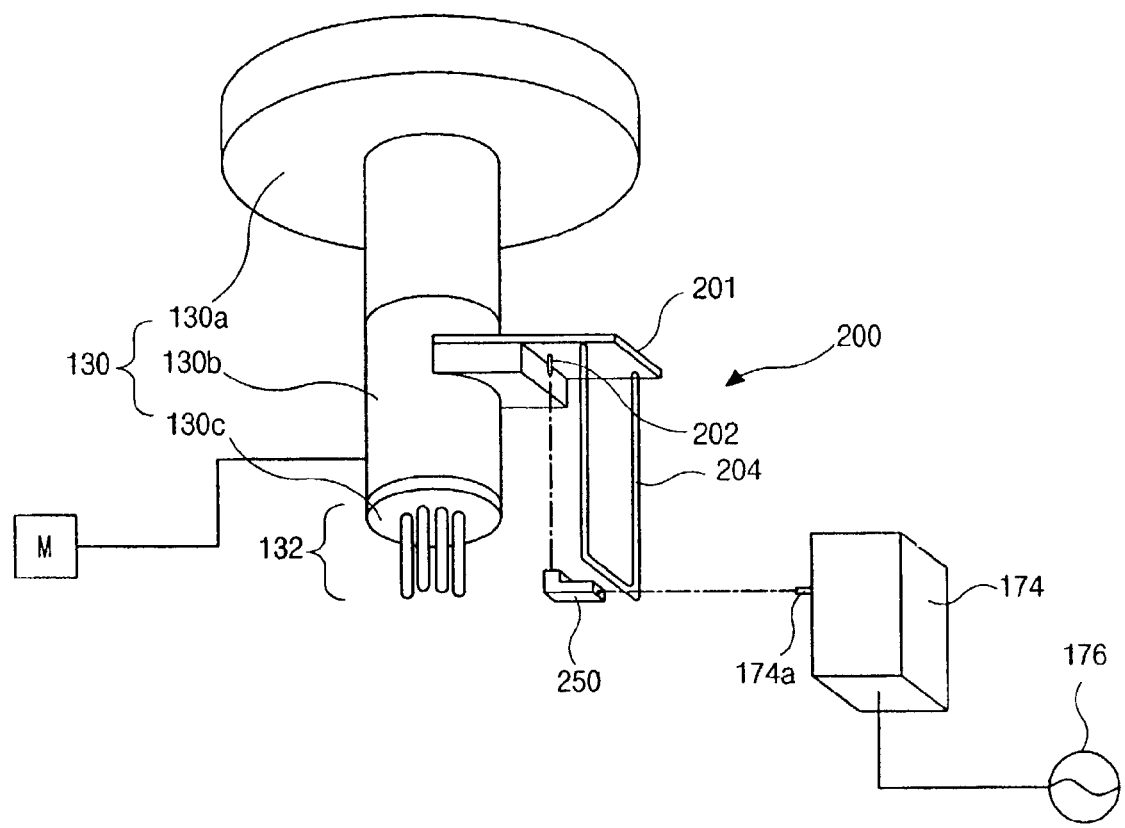
FIG. 2 is a schematic decomposed perspective view showing an apparatus including a chuck and a matching box according to an embodiment of the present invention.

FIG. 2 is a schematic decomposed perspective view showing an apparatus including a chuck and a matching box according to an embodiment of the present invention. The chuck according to the present invention includes a fixing means to fix the matching box onto the chuck. The present invention can be applied to all kinds of chucks equipped in a chamber defining a closed reaction region and treating a substrate with a plasma. The chuck supports the substrate and adjusts a temperature of the substrate during the substrate treating process.

As shown in FIG. 2, a chuck 130 includes a chuck body 130a and a chuck supporter 130b. The chuck body 130a having a plate shape is horizontally disposed in a closed reaction region of a chamber (not shown) and a substrate is loaded thereon. The chuck supporter 130b having a pipe shape supports the chuck body 130a and penetrates a surface of the chamber. The chuck supporter 130b has one end portion inside of the chamber and the other end portion outside of the chamber. The chuck body 130a and a base lid 130c are combined with the one end portion and the other end portion of the chuck supporter 130b, respectively. Moreover, an RF electrode controlling an impact energy of plasma ions generated in the chamber, a temperature control unit and a direct current (DC) electrode for holding the substrate can be equipped in the chuck body 130a. The chuck body 130a is horizontally combined with one end of the chuck supporter 130b. Each electrode is connected to each of a plurality of terminals 132 protruded from the base lid 130c. Each of the plurality of terminals 132 is connected to an external means supplying each electrode with a required element. In another embodiment, the plurality of terminals 132 can be formed on the other end portion of the chuck supporter 130b.

Among the plurality of terminals 132, an RF input terminal 202 connected to the RF electrode is formed on a fixing means to fix a matching box 174 to the chuck 130. An RF power is applied to the chamber through the RF input terminal 202. An RF power supply 176 is connected to the RF input terminal 202 through the matching box 174 including at least one matching circuit. The at least one matching circuit optimizes and transmits the RF power of the RF power supply 176 to the RF electrode. The at least one matching circuit, for example, an impedance matching circuit, is protected by the matching box 174 of a cubic shape. Especially, an RF supplying terminal 174a of a pin shape connected to the at least one matching circuit can be formed on an outer surface of the matching box 174.

The RF supplying terminal 174a is protruded from the outer surface of the matching box 174 and supplies the chuck 130 with the RF power matched by the at least one matching circuit. The matching box 174 is fixed to the other end portion of the chuck 130 by using the fixing means 200. The fixing means 200 includes a connection portion 201, an RF input terminal 202, a frame 204 and a connector 250. The connection portion 201 is horizontally protruded from and fixed to the other end portion of the chuck 130, and the RF input terminal 202 of a pin shape is electrically connected to the RF electrode in the chuck body 130a and protruded from a rear surface of the connection portion 201. The frame 204 is formed on the rear surface of the connection portion 201 and the matching box is fixed in the frame 204. The connector 250 electrically connects the RF supplying terminal 174a and the RF input terminal 202.

The fixing means 200 includes the connection portion 201 of a plate shape and the frame 204 of a rectangular shape. The connection portion 201 is substantially perpendicularly protruded from an outer surface of the chuck body 130b and the frame 204 is combined with the rear surface of the connection portion 201. The frame 204 has a size corresponding to the matching box 174. Moreover, the RF input terminal 202 of a pin shape is protruded from the rear surface of the connection portion 201 between the frame 204 and the chuck supporter 130b. The RF input terminal is electrically connected to the RF electrode in the chuck body 130a.

Figure 3:
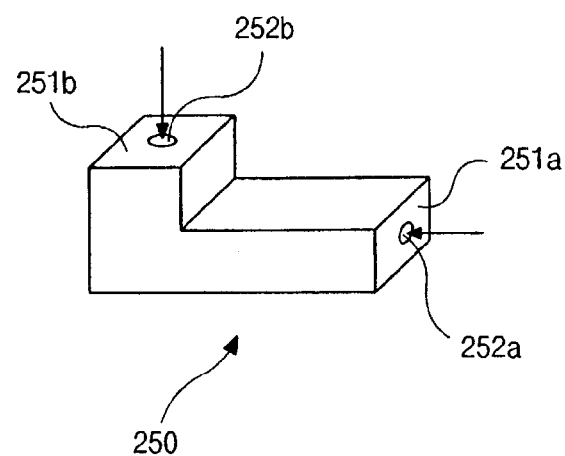
FIG. 3 is a schematic perspective view of a connector according to an embodiment of the present invention.

FIG. 3 is a schematic perspective view of a connector according to an embodiment of the present invention. As shown in FIG. 3, the connector 250 is a metal block including first and second surfaces 251a and 251b. The first surface 251a includes a first open portion 252a corresponding to an RF supplying terminal 174a (of FIG. 2) and faces a side surface of a matching box 174 (of FIG. 2). The second surface 251b includes a second open portion 252b corresponding to an RF input terminal 202 (of FIG. 2) and faces a rear surface of a connection portion 201 (of FIG. 2). A metal block of an "L" shape is used as the connector 250 to connect the RF supplying terminal 174a (of FIG. 2) of the matching box 174 (of FIG. 2) and the RF input terminal 202 (of FIG. 2) of the connection portion 201 (of FIG. 2). The connector 250 has the first open portion 252a, into which the RF supplying terminal 174a (of FIG. 2) is inserted, in the first surface 251a facing the matching box 174 (of FIG. 2). The connector 250 also has the second open portion 252b, into which the RF input terminal 202 (of FIG. 2) is inserted, in the second surface 251b facing the connection portion 201 (of FIG. 2). Since the RF supplying terminal 174a (of FIG. 2) and the RF input terminal 202 (of FIG. 2) are respectively inserted into the first and second open portions 252a and 252b, the RF supplying terminal 174a (of FIG. 2) and the RF input terminal 202 (of FIG. 2) are electrically connected to each other through the connector 250. Accordingly, the connector 250 is made of a conductive material such as copper.

Figure 4:
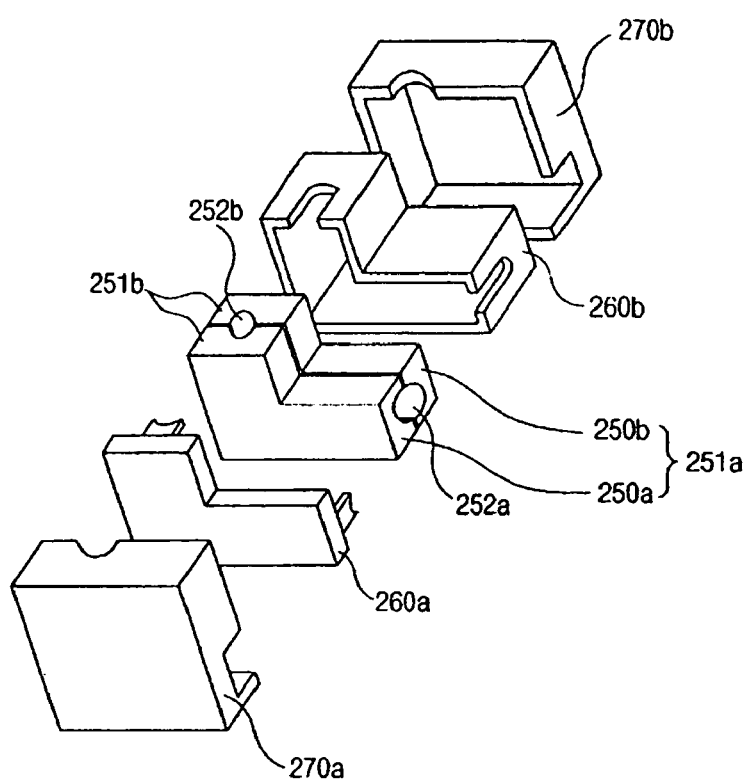
FIG. 4 is a schematic decomposed perspective view of a connector according to an embodiment of the present invention.

FIG. 4 is a schematic decomposed perspective view of a connector according to an embodiment of the present invention. As shown in FIG. 4, the connector 250 can be composed of first and second connector pieces 250a and 250b dividing the first and second open portions 252a and 252b for better connection. The first and second connector pieces 250a and 250b are combined with each other to compose the connector 250. Moreover, an insulating material and aluminum are sequentially coated on an outer surface of the connector 250. Preferably, TEFLON (polytetrafluoroethylene) is used as the insulating material to insulate the outer surface of the connector 250. Since a power passing through the connector 250 is an RF power having a high frequency, aluminum is coated on the insulating material to reduce a loss of the RF power with reliability. The insulating material and aluminum can be coated except for the first and second surfaces 251a and 251b. The insulating material and aluminum can be sequentially combined with the outer surface of the connector 250 as shown in FIG. 4. A first insulating material piece 260a covers an outer surface of the first connector piece 250a and a first aluminum piece 270a covers an outer surface of the first insulating material piece 260a. Similarly, a second insulating material piece 260b covers an outer surface of the second connector piece 250b and a second aluminum piece 270b covers an outer surface of the second insulating material piece 260b. The first and second connector pieces 250a and 250b compose one connector 250. The first and second insulating material pieces 260a and 260b compose one insulating material cover on the outer surface of the connector 250. The first and second aluminum pieces 270a and 270b compose one aluminum cover on an outer surface of the insulating material cover.

Consequently, since a fixing means for a matching box is formed on a chuck, a path for an RF power transmission is minimized. Accordingly, a higher efficiency of the RF power transmission can be obtained. Moreover, since the fixing means is constructed on a chuck supporter not to disturb an up-and-down movement of the chuck, the matching box is linked with the chuck and moves along the up-and-down movement of the chuck. Accordingly, the matching box and connection terminals are connected more reliably. Furthermore, since an RF supplying terminal protruded from the matching box and an RF input terminal protruded from the fixing means are connected to each other through a connector, the RF power is transmitted more effectively. The connector is made of a conductive material such as copper, and an insulating material and aluminum are sequentially coated on an outer surface of the connector ion portion. Accordingly, a fabricating process of a semiconductor device is improved.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An apparatus for fabricating a semiconductor device, comprising:
   a chamber;
   a radio frequency (RF) power supply supplying an RF power for the chamber;
   a matching box including a matching unit adjusting an impedance of the RF power; and
   a chuck penetrating a surface of the chamber, the chuck including a fixing means to fix the matching box to the chuck, the chuck including an RF electrode connected to the matching unit, and the chuck having one end portion inside of the chamber and the other end portion outside of the chamber,
   wherein the fixing means includes a connection portion protruded from and fixed to the chuck, and a frame formed on the connection portion, the matching box being fixed in the frame, the fixing means being formed on the other end portion of the chuck, and
   wherein the matching box includes an RF supplying terminal electrically connected to the matching box and protruded toward the chuck, the fixing means further comprising:
   the connection portion horizontally protruded from and fixed to the chuck,
   an RF input terminal electrically connected to the RF electrode and protruded from the connection portion, and
   a connector electrically connecting the RF supplying terminal and the RF input terminal.

2. The apparatus according to claim 1, wherein the chamber defines a closed reaction region.

3. The apparatus according to claim 1, wherein the matching box has a cubic shape.

4. The apparatus according to claim 1, wherein the RF supplying terminal and the RF input unit have a pin shape, the connection portion has a plate shape, and the frame has a rectangular shape.

5. The apparatus according to claim 1, wherein the connector is a metal block comprising:
   a first surface including a first open portion corresponding to the RF supplying terminal and facing the matching box; and
   a second surface including a second open portion corresponding to the RF input terminal and facing the connection portion.

6. The apparatus according to claim 5, wherein the connector includes copper.

7. The apparatus according to claim 5, wherein the connector has an "L" shape.

8. The apparatus according to claim 5, further comprising a first cover surrounding the metal block except for the first and second surfaces and a second cover surrounding the first cover.

9. The apparatus according to claim 8, wherein the first and second covers include an insulating material and aluminum, respectively.

10. The apparatus according to claim 9, wherein the insulating material includes polytetrafluoroethylene.

* * * * *